(12) United States Patent
Gottmann et al.

(10) Patent No.: US 7,391,137 B2
(45) Date of Patent: Jun. 24, 2008

(54) CIRCUIT ARRANGEMENT FOR EMC INTERFERENCE SUPPRESSION FOR A DIRECT CURRENT MOTOR AND A SWITCHING MODULE

(75) Inventors: Wolfgang Gottmann, Stamsried (DE); Michael Kirchberger, Neutraubling (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 10/564,028

(22) PCT Filed: Jul. 2, 2004

(86) PCT No.: PCT/EP2004/051344
§ 371 (c)(1),
(2), (4) Date: May 2, 2006

(87) PCT Pub. No.: WO2005/006519
PCT Pub. Date: Jan. 20, 2005

(65) Prior Publication Data
US 2007/0035935 A1 Feb. 15, 2007

(30) Foreign Application Priority Data
Jul. 8, 2003 (DE) ................. 103 30 806

(51) Int. Cl.
*H02K 11/00* (2006.01)
(52) U.S. Cl. ...................... 310/68 R; 310/51
(58) Field of Classification Search ........ 310/68 R, 310/71, 51, DIG. 6; 315/411; 333/158, 181; 336/221, 233, 175, 171
See application file for complete search history.

(56) References Cited

U.S. PATENT DOCUMENTS

| | | | | |
|---|---|---|---|---|
| 3,781,740 A | * | 12/1973 | Kirmis et al. | 336/96 |
| 4,890,044 A | * | 12/1989 | Clayburn | 315/411 |
| 5,313,126 A | * | 5/1994 | Forsythe et al. | 310/51 |
| 5,455,552 A | * | 10/1995 | Metsler | 336/65 |
| 5,568,111 A | * | 10/1996 | Metsler | 336/65 |
| 5,896,079 A | * | 4/1999 | Parker | 336/221 |
| 5,997,267 A | | 12/1999 | Lee | |
| 6,198,183 B1 | * | 3/2001 | Baeumel et al. | 310/52 |
| 6,232,684 B1 | | 5/2001 | Haag et al. | |
| 6,371,265 B1 | * | 4/2002 | Arrouy et al. | 191/2 |
| 6,680,587 B1 | * | 1/2004 | Trestman et al. | 315/291 |
| 2003/0001448 A1 | * | 1/2003 | Kaeufl et al. | 310/91 |

FOREIGN PATENT DOCUMENTS

| | | |
|---|---|---|
| DE | 198 17 333 C1 | 12/1999 |
| DE | 100 13 431 A1 | 9/2001 |
| EP | 0 336 530 B1 | 9/1994 |
| EP | 0 809 346 B1 | 8/2001 |
| FR | 2 742 006 | 6/1997 |
| GB | 2 217 136 A | 10/1989 |

OTHER PUBLICATIONS

Communication of the German Patent Attorneys, 2004, Notebook 5, pp. 215-218.

* cited by examiner

*Primary Examiner*—Tran Nguyen
(74) *Attorney, Agent, or Firm*—Laurence A. Greenberg; Werner H. Stemer; Ralph E. Locher

(57) ABSTRACT

The invention relates to a circuit arrangement and a switching module, in which an attenuator is, for EMV suppression of a DC motor, connected to the lines of the DC motor. The attenuator comprises a ferrite, particularly a common mode ferrite.

12 Claims, 2 Drawing Sheets

CIRCUIT ARRANGEMENT FOR EMC INTERFERENCE SUPPRESSION FOR A DIRECT CURRENT MOTOR AND A SWITCHING MODULE

BACKGROUND OF THE INVENTION

Field of the Invention

The invention is based on a circuit arrangement for EMC interference suppression for a direct current motor, with an attenuation element being connected in the supply line of the direct current motor and a switching module with an attenuation element connected in the supply line of the direct current motor, forming a high resistance for high-frequency signals in particular.

It is already known for example in the case of a direct current (DC) motor, the rotors of which are supplied with current via brushes, that the sparking that results at the collector has to be suppressed or at least attenuated such that the resulting interfering radiation is harmless. This interference suppression to achieve electromagnetic compatibility—hereafter abbreviated to EMC interference suppression—is achieved by means of an attenuation element, which generally comprises a number of electronic components. For example two Y-capacitors are connected in series in the two supply lines towards the motor housing with two paralleling reactors, to increase the high frequency resistance. Sparking can be attenuated using this measure but its use of four components means that it is relatively complex and requires significant additional integration space, which is not available in the case of many applications or significantly restricts the design.

It is also known that EMC ferrites can be used to decouple line-conducted high-frequency signals, in particular high-frequency interference signals, as can occur for example in the cable connections between a computer and a monitor, printer, data lines, etc. Such ferrites are marketed for example by the company Würth Elektronik or Vacuumschmelze and are available in different forms. Such attenuation elements are however only provided for use in computer and data lines and can only transmit a direct current limited to several amperes.

SUNNARY OF THE INVENTION

The object of the invention is to create a circuit arrangement and a switching module with a simplified and more economical attenuation element. This object is achieved in that the attenuation element comprises a ferrite material and is disposed on a printed circuit, which serves to control the direct current motor, and in that the attenuation element comprises a common mode ferrite and is disposed on the printed circuit as close as possible to or in the direct current motor, and in that the attenuation element, the printed circuit, and the direct current motor are integrated in a shared housing.

In contrast to the known prior art, with the claimed circuit arrangement and switching module it is proposed that a ferrite material should be used as the attenuation element. Such a component can generally be obtained at lower cost than the four components generally used for EMC interference suppression. Also it can be integrated more easily and faster, so the production costs for the DC motor are more favorable. It is deemed particularly advantageous that because of its structural and physical characteristics the ferrite material of the attenuation element is effective across a wider band than a conventional attenuation element, so that it is possible in particular to attenuate even high current peaks with high frequencies more effectively.

The measure listed in the dependent claims define advantageous developments and improvements of the circuit arrangement and switching module specified in the independent claims. It is deemed particularly advantageous that the attenuation element has a common mode ferrite. This material is designed particularly for the attenuation of high-frequency interference signals, caused by the sparking of the DC motor.

Optimum EMC interference suppression is achieved when the attenuation element is disposed as close as possible to the DC motor and therefore the interference source. The resulting interference signals are then attenuated directly without being able to inject themselves into adjacent lines or circuit elements.

In a particularly advantageous solution the attenuation element is disposed directly on a printed circuit used to control the DC motor. The attenuation element can then be preproduced together with other electronic components, required for example to control the DC motor.

Further miniaturization can be achieved if the attenuation element is configured as an SMD circuit, giving a particularly small design.

It also appears advantageous to configure the printed circuit such that it is also possible to insert the attenuation element later. As EMC interference suppression is not necessary for all motor types or applications, the attenuation element can also be integrated later. It is then particularly favorable if a standard printed circuit can still be used.

The attenuation element is configured particularly to suppress or attenuate the interference signals due to sparking resulting at the commutator of the DC motor. Injection into adjacent lines or functional interference to adjacent circuit elements can thus be effectively suppressed.

A particularly advantageous application of the claimed circuit arrangement relates to DC motors required to drive a unit or auxiliary generating set in a motor vehicle. These are particularly the type of DC motor required for transmission control, windshield wipers, a window closing system, a seat adjuster, etc.

BRIEF DESCRIPTION OF THE DRAWINGS

An exemplary embodiment of the invention is described in more detail in the description that follows and illustrated in the drawings, in which.

DESCRIPTION OF THE PREFERRED EMBODIMENTS

Figure 1:
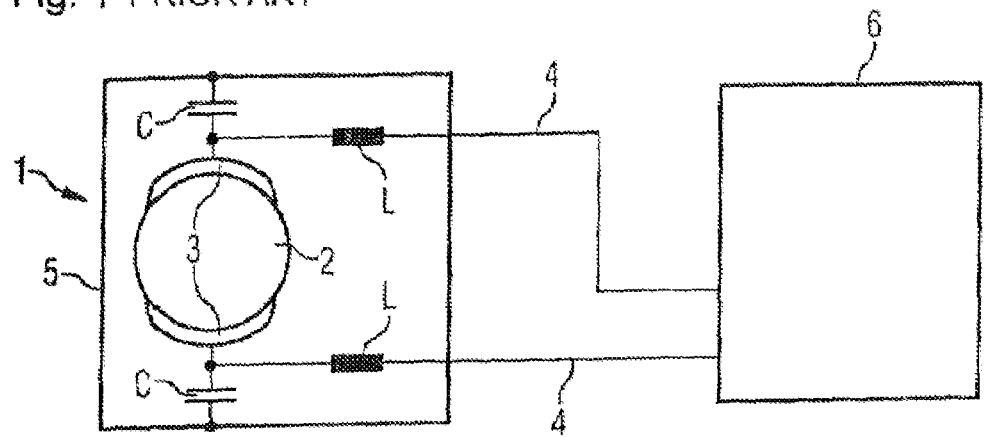
FIG. 1 shows a schematic illustration of a circuit diagram of a DC motor with a conventional attenuation element.

For a clearer understanding of the invention it is first explained with reference to FIG. 1 how the interference signals resulting due to sparking were suppressed or attenuated until now in a DC motor. The schematic illustration in FIG. 1 shows a DC motor 1, with a rotor 2 disposed in a housing 5, having a number of current windings that are supplied individually and being configured to be able to rotate in a static magnetic field. Current is supplied to the rotor 2 via a commutator, which supplies the current windings of the rotor 2 with a constant or pulsed direct current by means of two brushes 3 disposed opposite each other. Each individual current winding of the rotor 2 is connected to two contact surfaces of the commutator in a paired manner, across which the brushes 3 pass. As the brushes 3 pass over to adjacent contact surfaces, unwanted sparking occurs, emitting interference signals in the high-frequency range in particular, which are for example transmitted to adjacent power lines and can interfere sensitively with electronic circuit components. This interfering radiation, referred to as EMC interference, is generally attenuated using an L/C element, generally comprising two capacitors C and two interference suppression coils L. As shown in FIG. 1, the two capacitors C, each for example 10 nF, are connected in a Y-circuit between a line 4 and the housing 5 respectively, as close as possible to the brushes 3. An interference suppression coil L, with 7 µH for example, is connected respectively to the lines 4. This L/C element should if possible be integrated into the housing, as interference suppression close to the interference source is the most effective.

For direct current this L/C element is low-resistance, while for steeply rising and high-frequency signals it has a relatively high resistance effect, as will be explained later. The DC motor 1 is connected via the lines 4 to a control circuit for controlling engine speed and torque, said control circuit frequently being located on a printed circuit 6 or PCB (printed circuit board). If the space situation permits, the PCB 6 can be disposed on or in the housing 5.

Figure 2:
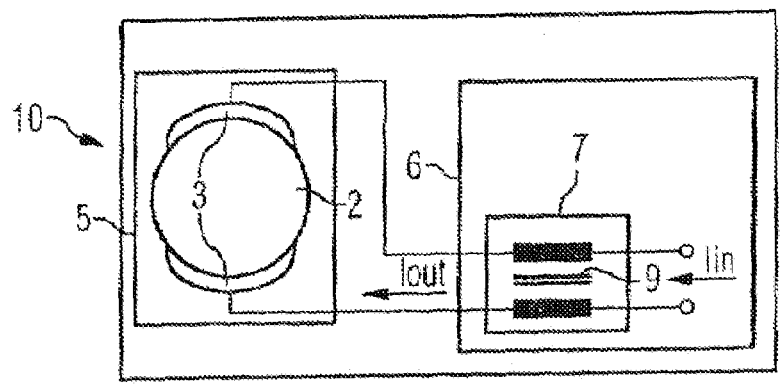
FIG. 2 shows a schematic illustration of a circuit diagram of a DC motor with a claimed attenuation element.

FIG. 2 shows a schematic illustration of an exemplary embodiment of the invention. Instead of the L/C element, an attenuation element 7 is now connected upstream from the DC motor 1 described above, said attenuation element 7 being configured with a ferrite, in particular a common mode ferrite 9 (also referred to as a common mode or CM choke). Such ferrites generally comprise a number of layers or a sintered material, to achieve the highest possible impedance. To this end the two lines 4 are wound round the common mode ferrite 9 such that their magnetic fields mutually compensate each other. According to the known prior art common mode ferrites are only recommended for decoupling line-conducted interference in the high-frequency range. They are commercially available for different applications as an integrable component, e.g. as an SMD component, to facilitate assembly on a printed circuit. These components are typically used for measuring signal sensors, monitor lines, printer and mouse cables, data transmission lines, etc. The ferrites are available as block cores, ribbon cable ferrites, ferrite sleeves, ferrite rings, ferrite beads and ferrite bridges.

With the claimed exemplary embodiment however it is proposed according to FIG. 2 that such a common mode ferrite 9 be modified such that the attenuation element 7 can be used to suppress the interference of the DC motor 7, in particular to suppress its sparking. To this end a circuit arrangement is proposed, in which the attenuation element 7 can be integrated on a correspondingly prepared PCB 6 close to or if possible in the housing 5 of the DC motor 1, i.e. in proximity to the brushes 3.

In a preferred embodiment of the invention, the attenuation element 7 is configured for example as an SMD (surface mounted device) component and only assembled on the PCB 6 if required.

The PCB 6 is preferably configured such that it can be built together with the housing 5 of the DC motor 1 as a compact switching module in a shared housing. The PCB 6 also includes a control circuit, configured with a PWM (pulse width modulation) circuit for controlling the speed, torque and/or path of the DC motor 1. Such switching modules 10 can then be used for example in a motor vehicle for controlling different units and auxiliary generating sets such as windshield wipers, window closing systems, seat adjusters and/or for transmission control. In the last instance in particular the attenuation element 7 must be designed for very high peak currents, for example up to 40 A. With the commercially available common mode ferrites 9 the peak currents are generally only a few amperes, so a corresponding modification is required in order to be able to achieve the required attenuation measures even with very large currents.

It is also advantageous if the attenuation element 7 and common mode ferrite 9 can be configured significantly smaller than is the case with the conventional L/C element. This means that less space is required so the housing 5 of the DC motor 1 can also be configured correspondingly smaller and more economically. Also the attenuation can be designed to be more effective and over a wider band, as shown below with reference to comparison diagrams.

Figure 3:
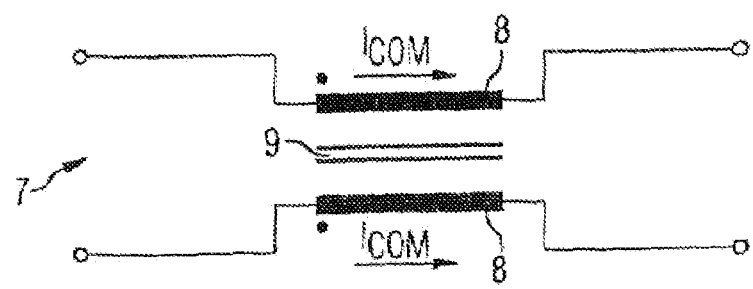
FIG. 3 shows a claimed embodiment of the attenuation element.

FIG. 3 shows a circuit diagram for the attenuation element 7, which is configured as a component with at least two input and two output terminals. It has a common mode ferrite 9, around which the two power lines are wound such that the interference levels of the two currents $I_{COM}$ mutually compensate each other. For steep current edges and high-frequency currents or voltages this attenuation element 7 is high resistance, while for direct current it is low resistance, so that the direct current can flow practically unimpeded to the DC motor 1.

Figure 4:
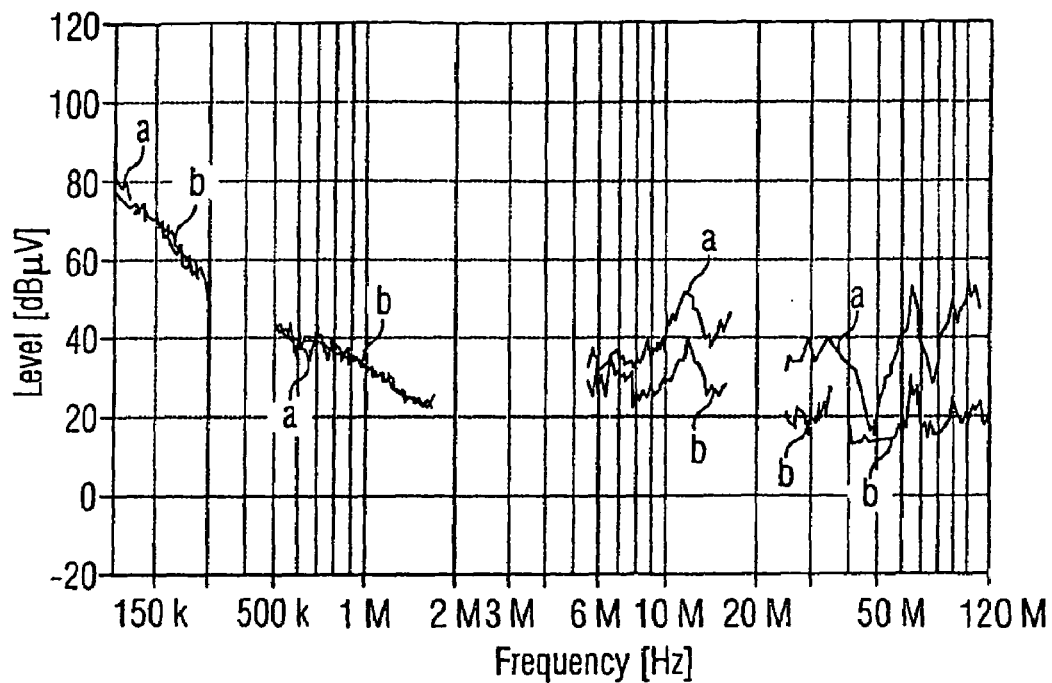
FIG. 4 shows a first diagram with two interference voltage graphs and FIG. 5 shows a second diagram with three interference voltage graphs.

The mode of operation of the claimed circuit arrangement is described in more detail with reference to FIGS. 4 and 5. FIG. 4 shows a first diagram, in which the signal frequency in Hz is shown on the x-axis and the amplitude (level in dBµV) is shown on the y-axis. The graphs shown represent individual instances for a specific DC motor 1. The segments of the graph a (thin line) show the sparking of the DC motor 1 with reference to a measurement protocol, when there is no EMC interference suppression. It can be seen here that the interfering radiation is particularly high at low frequencies in particular, drops a little as the frequency increases and rises again in the frequency range 6 to approx. 120 MHz.

In contrast the segments of the graph b (thick line) show the instance when the same DC motor 1 is connected to the claimed attenuation element 7. With this exemplary configuration of the common mode ferrite 9 there is no evident significant difference compared with the graph a in the lower frequency range up to approx. 2 MHz. At higher frequencies from approx. 6 MHz the interference level of the graph b is however significantly reduced. While the interference level of the graph a shows a level between approx. 30 and 50 dBµV, the level for the graph b is only in a range from approx. 10 to 30 dBµV. The same can be seen in the frequency range 25 to 120 MHz. This is a significant reduction in the interference level compared with the instance without interference suppression in graph a.

Figure 5:
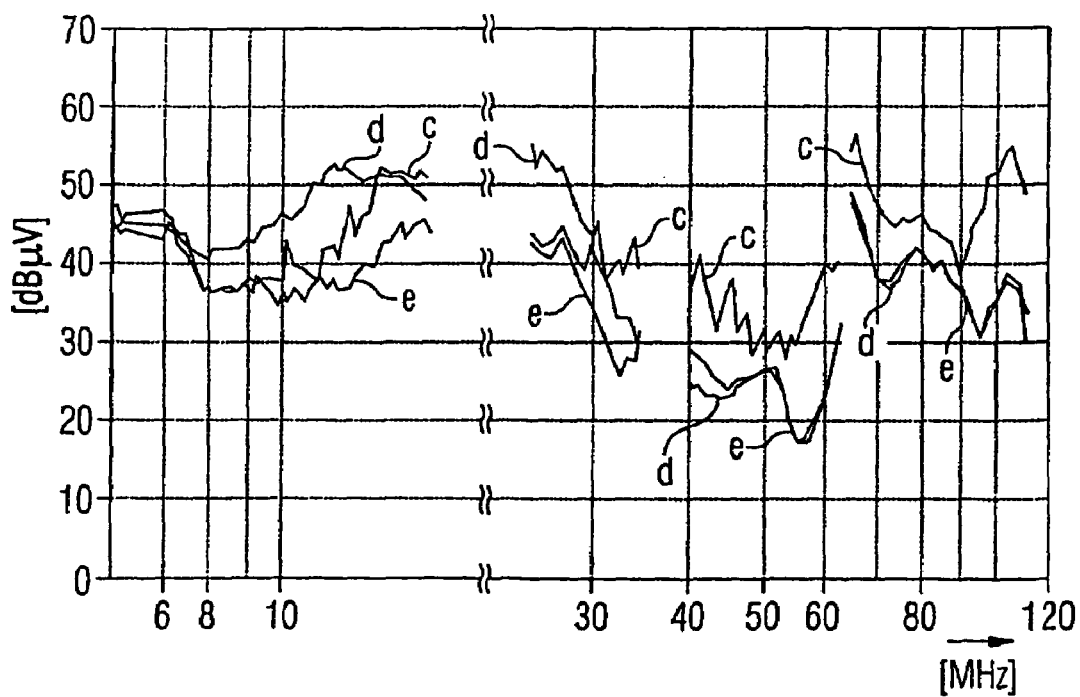

FIG. 5 shows a second diagram with a similar scale, as already described in respect of FIG. 4. Here however the frequency range on the x-axis is considered in the interval from approx. 5 MHz to approx. 120 MHz. The diagram shows three different measurement graphs c, d, e. The segments of the graph c show the instance when the DC motor 1 is connected without attenuation element 7. The segments of the graph d show the interference level pattern when the DC motor 1 was connected to a conventional L/C element with L=7 μH and C=10 nF. The segments of the graph e with a thick line show the instance when the DC motor 1 was connected to the claimed common mode ferrite 9. It can be seen from the graph segments in the four frequency ranges shown that the interference level for the graph e is generally lower than for graphs c and d. It is particularly clear that in the mean frequency range between 25 and 35 MHz the interference level of the graph e is significantly lower than for the graph d, which corresponds to assembly with the conventional L/C element. This frequency range can of course be displaced, if the attenuation element 7 has different dimensions.

A further advantage is that the structure with the common mode ferrite 9 can be significantly smaller than with the conventional L/C element, so that further structural advantages result, as already mentioned above.

We claim:

1. A circuit configuration for electromagnetic interference suppression for a direct current motor, the direct current motor having a supply line and a printed circuit with a control circuit for controlling at least a speed or a torque of the direct current motor, the circuit configuration comprising:

an attenuation element connected in the supply line of the direct current motor, said attenuation element being configured to attenuate electromagnetic interference signals generated in the direct current motor, containing a ferrite material, and being disposed on the printed circuit together with the control circuit for controlling the direct current motor;

said attenuation element being a common mode ferrite.

2. The circuit configuration according to claim 1, wherein the direct current motor has a housing, and said attenuation element is disposed as close as possible to said housing of the direct current motor.

3. The circuit configuration according to claim 1, wherein the direct current motor has a housing, and said attenuation element is disposed in said housing of the direct current motor.

4. The circuit configuration according to claims 1, wherein the printed circuit with said attenuation element and the direct current motor are disposed in a common housing suitable for use as a switching module.

5. The circuit configuration according to claim 4, wherein said attenuation element is configured to attenuate interference signals due to sparking at a commutator of the direct current motor.

6. The circuit configuration according to claim 1, wherein said attenuation element is a surface mounted device circuit.

7. The circuit configuration according to claim 6, wherein said attenuation element is configured to attenuate interference signals due to sparking at a commutator of the direct current motor.

8. The circuit configuration according to claim 1, wherein said printed circuit is configured for later insertion of said attenuation element.

9. The circuit configuration according to claim 8, wherein said attenuation element is configured to attenuate interference signals due to sparking at a commutator of the direct current motor.

10. The circuit configuration according to claim 1, wherein the direct current motor is configured to drive an auxiliary assembly for a motor vehicle.

11. The circuit configuration according to claim 1, wherein the direct current motor is a drive motor of an assembly selected from the group of a transmission control, windshield wipers, a window closing system, and a seat adjuster.

12. A switching module, comprising:

a direct current motor;

a printed circuit connected to said direct current motor, said printed circuit containing a control circuit for controlling said direct current motor and an attenuation element connected in a supply line of said direct current motor;

said attenuation element having a common mode ferrite and being disposed on said printed circuit as close as possible to or in said direct current motor; and a common housing enclosing said printed circuit, said attenuation element, and said direct current motor.

* * * * *